United States Patent [19]

Benesch

[11] Patent Number: 4,803,456
[45] Date of Patent: Feb. 7, 1989

[54] SUPERCONDUCTIVE SWITCH

[75] Inventor: Jay F. Benesch, Schenectady, N.Y.

[73] Assignee: General Electric Company, Milwaukee, Wis.

[21] Appl. No.: 136,890

[22] Filed: Dec. 22, 1987

[51] Int. Cl.[4] .............................................. H01L 43/00
[52] U.S. Cl. .................................... 338/32 S; 307/245
[58] Field of Search .............. 338/32 S; 307/245, 306; 505/860

[56] References Cited

U.S. PATENT DOCUMENTS

| | | | |
|---|---|---|---|
| 3,054,978 | 9/1962 | Schmidlin et al. | 338/32 S |
| 3,359,394 | 12/1967 | Mains | 200/166 |
| 3,704,391 | 1/1972 | McConnell | 338/32 S X |
| 3,715,703 | 2/1973 | Croso et al. | 338/32 S |
| 3,764,828 | 10/1973 | Croso et al. | 338/32 S X |
| 4,164,777 | 8/1979 | Kneip, Jr. et al. | 338/32 S |
| 4,586,017 | 4/1986 | Laskaris et al. | 338/32 S |

Primary Examiner—E. A. Goldberg
Assistant Examiner—M. M. Lateef
Attorney, Agent, or Firm—Quarles & Brady

[57] ABSTRACT

A superconducting switch is bifilarly wound with two superconductors. The superconductors are wound around a core inside a housing and are electrically insulated from one another. One of the superconductors is radially further out than the other and a common heater element is between the superconductors to switch both superconductors substantially simultaneously between the persistent and non-persistent states.

11 Claims, 3 Drawing Sheets

SUPERCONDUCTIVE SWITCH

BACKGROUND OF THE INVENTION

1. Field of the Invention

This invention relates to a switch for superconductive circuits, and more particularly to such a switch for two or more superconductive circuits which must be switched simultaneously.

2. Discussion of the Prior Art

Switches for turning superconductive circuits on and off are well known. They typically comprise a length of superconductive wire and a heater element. The switch is cooled to a very low critical temperature (a few degrees Kelvin) by immersing it in a cryogen such as liquid helium. At or below the critical temperature, the resistance of the wire falls to zero, thereby making the wire superconductive. In the superconductive or persistent state, the switch is "on" because it has no resistance. The switch is turned off by turning the heater element on, which raises the temperature of the superconductive wire above the critical temperature, thereby producing a finite resistance to the flow of current.

Switches of this type are often used in circuits which include a superconductive magnet coil, such as in a magnetic resonance (MR) scanner. There may be many superconductive magnet coils, each having its own switch, which cooperate to produce a desired magnetic field. As such they are inductively coupled, i.e. the portion of the magnetic field which each contributes is affected by the magnetic fields which the other magnets produce. Changing the current through one of the coils changes the magnetic field it produces, which changes the current through any other coils inductively coupled with that coil, which changes their magnetic fields, which changes the current through the first coil, etc. Thus, inductive coupling creates a problem in adjusting the current through each magnetic coil because of their interrelationships. Also, individually adjusting each coil would result in a relatively large boil-off of liquid helium because of the time and number of changes in current which would be required.

This problem is overcome by switching all the inductively coupled magnet coils substantially simultaneously. During charging, each switch is connected in parallel with the corresponding magnet coil and a power supply for the particular switch which is adjustable to ramp up to the desired current through the coil at the same time that the desired currents through all the other coils are reached. During ramping the switches are off. At the time the desired currents are reached, all of the switches are turned on at substantially the same time to conduct the persistent current and the power supplies are disconnected.

SUMMARY OF THE INVENTION

The invention provides a superconducting switch having a housing, at least two lengths of superconductor in said housing, each said length being electrically insulated from the other length and having ends which extend outside of the housing for connection to a superconducting circuit. A heater element in the housing is in thermal communication with each length of superconductor and controls whether both lengths of superconductor are persistent or nonpersistent and does so substantially simultaneously. Thus, only one heater is used to control two or more superconductive switches substantially simultaneously. This also reduces the number of electrical joints which must be made to connect the switch in a circuit.

In the preferred embodiment, the switch has two lengths of superconductor wound around a core. The lengths of superconductive wire are wound around the core with one of the lengths radially outward from the other and the heater element radially between the two windings. Thus, both sides of the heater element are used to switch the two windings.

Each of the superconductive wires should be bifilarly wound around the core so as to be non-inductive. To do so, the core has an arcuate groove defined in its end and the winding of the radially inner length of superconductor is started in the groove and wound around the core. An end plate is placed against the end of the core having the groove in it and an arcuate groove is defined in the end plate surface facing the core radially further out than the groove in the core. The winding of the radially further out length of superconductive wire is started in the end plate groove and is held in the end plate groove by the radially inward windings covering at least part of the groove.

It is therefore a principal object of the invention to provide a superconducting switch using a single heater to control more than one superconducting circuit substantially simultaneously.

It is another object of the invention to provide a superconducting switch in which both sides of a heater element are used to control at least two superconducting circuits.

It is another object of the invention to provide such a superconducting switch which is noninductive so as not to interfere with a magnetic field.

It is another object of the invention to provide a reliable superconducting switch which can be economically made and incorporated into an electrical circuit.

These and other objects of the invention will be apparent from the drawings and from the detailed description.

DETAILED DESCRIPTION OF THE PREFERRED EMBODIMENT

Figure 1:
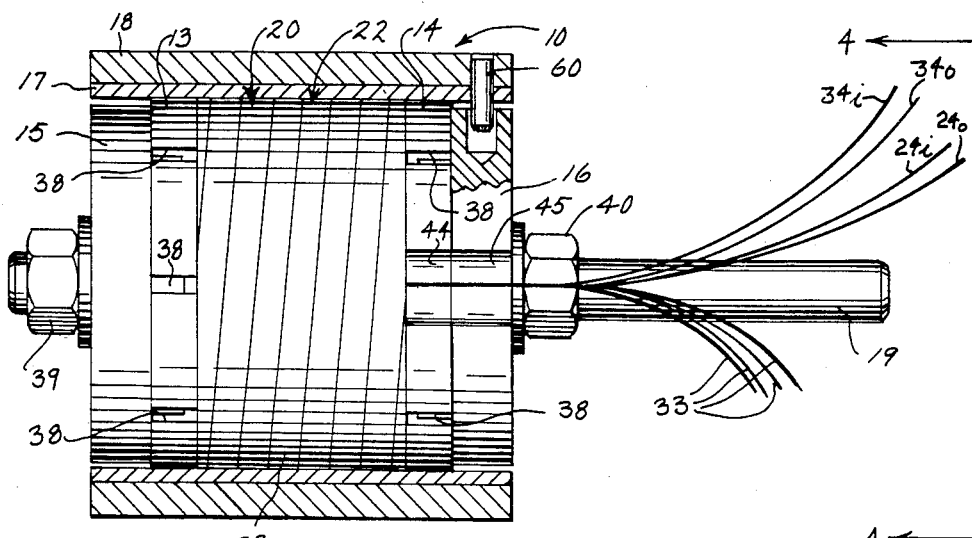
FIG. 1 is a side elevation view of a switch of the present invention shown partially in section.

FIG. 1 shows a superconducting switch 10 of the present invention. The switch 10 is particularly adapted for use in the charging circuits of two shim magnet coils for an MR scanner. Further explanation of how superconducting switches can be incorporated in charging circuits for a superconducting magnet coil is available in U.S. Pat. No. 4,586,017.

The switch 10 includes a solid glass-epoxy composite core 12, inner nylon end plates 13 and 14, outer aluminum end plates 15 and 16, a nylon insulator sleeve 17, an aluminum housing 18 and windings generally designated 20 around the core. A stud 19 helps hold the assembly together and the entire assembly is vacuum impregnated with an epoxy. When the epoxy cures, a solid epoxy body fills the voids in the switch and fixes the windings against movement within the switch when the switch is placed in a magnetic field.

Figure 2:
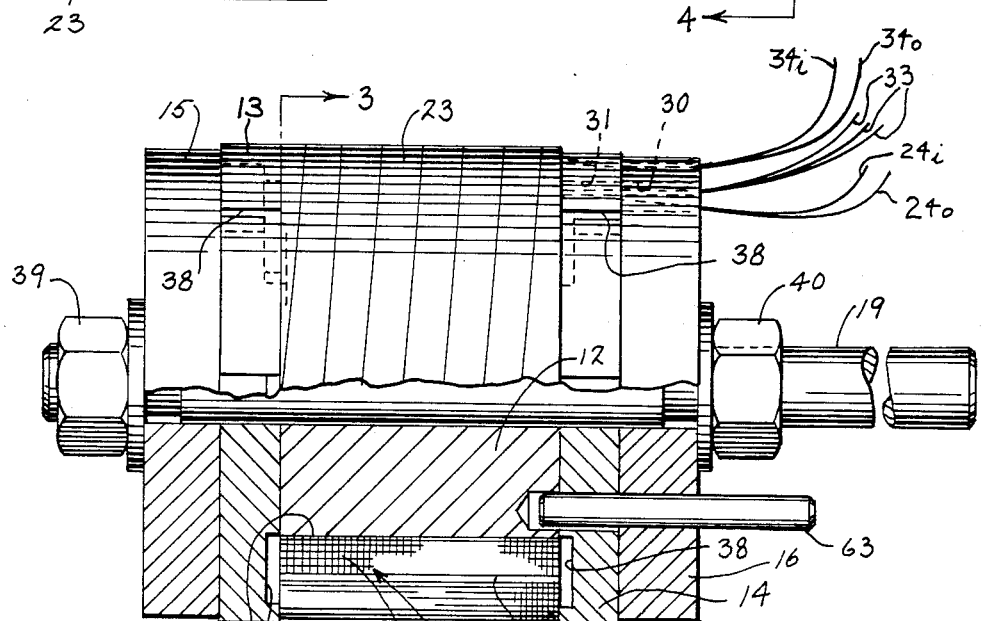
FIG. 2 is a side elevation view partially in section of the switch of FIG. 1 rotated 90° and illustrated without the outer housing and insulator sleeve shown in FIG. 1.
Figure 10:
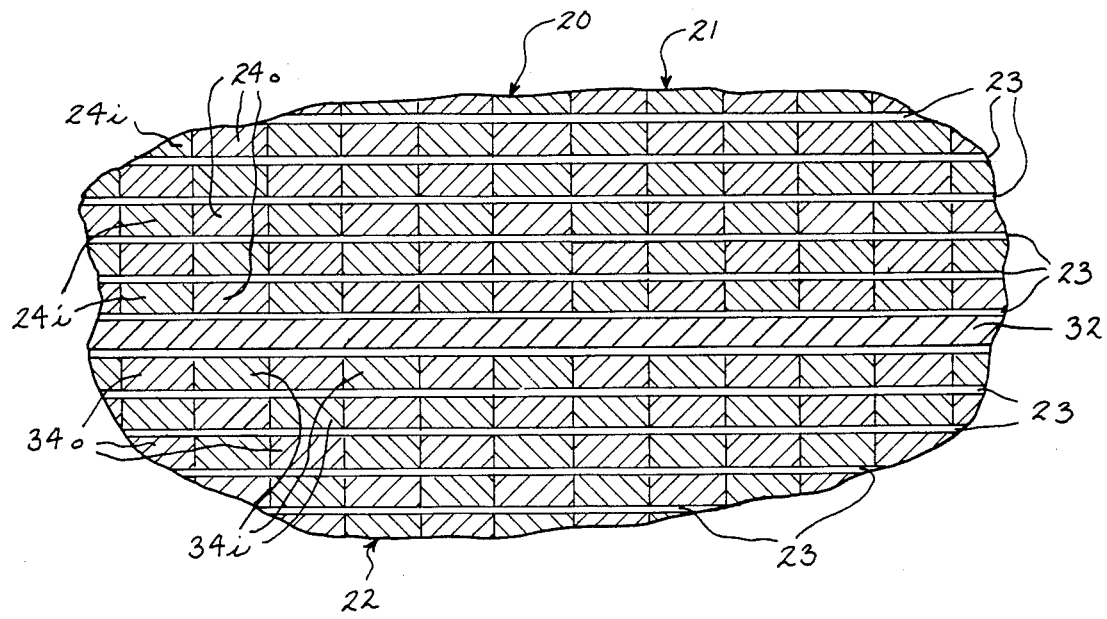
FIG. 10 s a detail view of a portion of FIG. 2 illustrating the heater sheet and the adjacent windings.

Referring to FIGS. 2 and 10, the windings 20 include inner windings 21 and windings 22 which are radially outward from the windings 21. Each set of windings 21 and 22 consists of alternating layers of epoxy compatible fiberglass wrappings 23 and turns of superconducting wire designated 24 for winding 21 and 34 for winding 22. Each set of windings 21 and 22 is made with one superconductive wire 24 or 34 which is bifilarly wound to eliminate any external field which would otherwise be produced by the superconducting winding.

Figure 5:
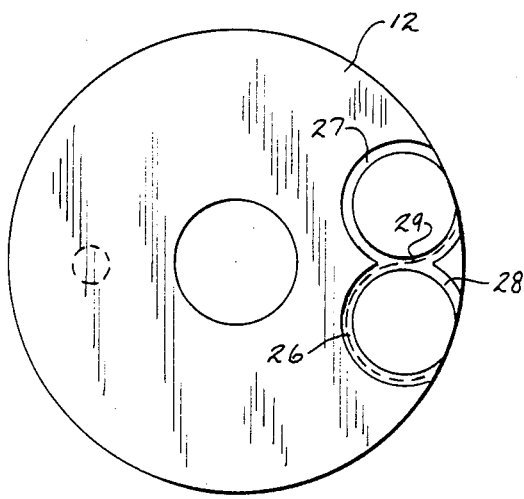
FIG. 5 is an end elevation view of a core for the switch.
Figure 6:
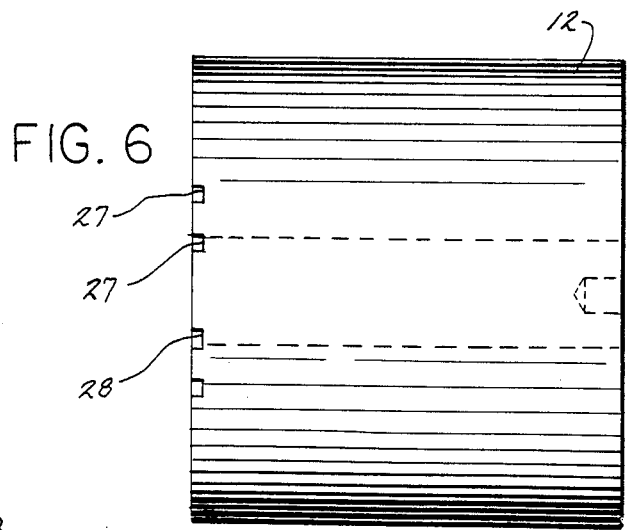
FIG. 6 is a side elevation view of the core of FIG. 5.

The winding 21 is started on the core 12 by first wrapping the core with 0.003" epoxy compatible glass 23. The superconductive wire 24 of winding 21 is bifilarly wound by playing out half of the length of the wire and looping the middle in teardrop-shaped groove 26 indicated by center line 29 in the end of the core 12 (FIG. 5). The groove 26 is defined by portions of two adjacent circular grooves 27 and 28 for ease of manufacturing. The two ends 24i and 24o (FIG. 3) of the wire 24 on either side of the groove 26 are then wound in side-by-side relation around the core 12.

When the end of the first layer of wire 24 is reached, another layer of epoxy compatible glass felt 23 nominally 0.009" thick is wrapped over the layer. Then, in going from the first layer to the second layer, the ends 24i and 24o are crossed over to begin winding the second layer of wire. The cross-over should be made in such a fashion as to make the "i's" and "o's" resemble a chessboard in cross-section, alternating both within each layer and from layer to layer of wire, as best shown in FIG. 10 ("i's" are section lined in one direction and "o's" in the other). Cross-overs should be packed with fiberglass to avoid regions of unsupported epoxy (after impregnation) greater than 0.010" thick. This process is repeated until nine layers of superconductive wire 24 are wound on the core 12. After the nine layers are complete, the ends 24i and 24o are guided out through slot 30 in end plate 16 and through a corresponding slot 31 in end plate 14 to exit the switch 10. A suitable piece of electrical insulating tubing (not shown) should be provided around the ends 24i and 24o where they exit through the end plates 14 and 16.

Figure 9:
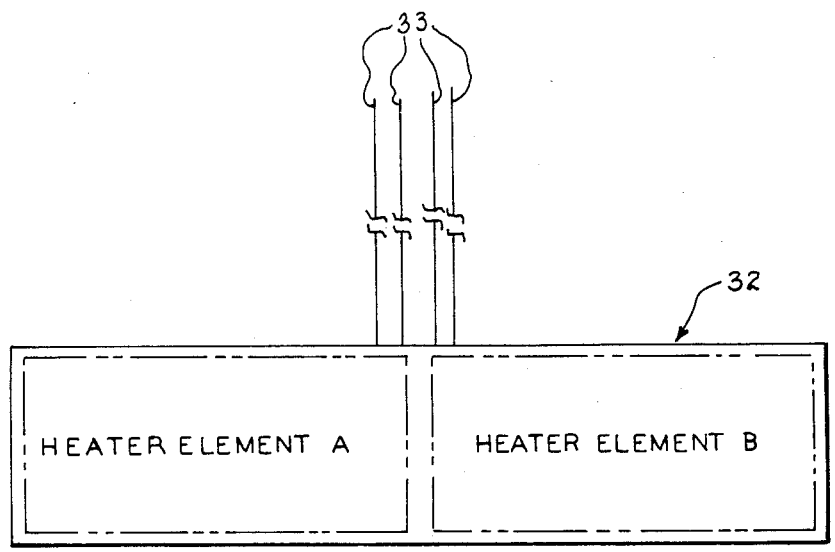
FIG. 9 is an elevation view of a heater sheet for the switch of FIG. 1.

The ninth layer of superconductor is then overwrapped with two layers of 0.003" fiberglass 23 which may be in the form of tape to help hold the windings 21 together during assembly. A sheet 32 shown in FIG. 9 which is substantially as wide as the windings 21 and about as long as the circumference of the completed windings 21 is then wrapped over the glass tape. The sheet 32 has two side-by-side nickel chromium heaters A and B embedded in it and may have copper foil backing on both sides to help conduct heat from each side. Each heater element can generate four watts per square inch and has a resistance of about 8.5 ohms. Four heater leads 33, two from each heater, are guided out through the same slots as the wires 24i and 24o in the end plates 14 and 16, and the heater is overwrapped with two half-lapped layers of 0.003" fiberglass 23, which may also be glass tape, to hold the heater sheet 32 in place.

In practice, only one of the heaters A and B embedded in the sheet 32 is used. However, if one of the heaters fails, the other heater can be used for a back-up.

Figure 7:
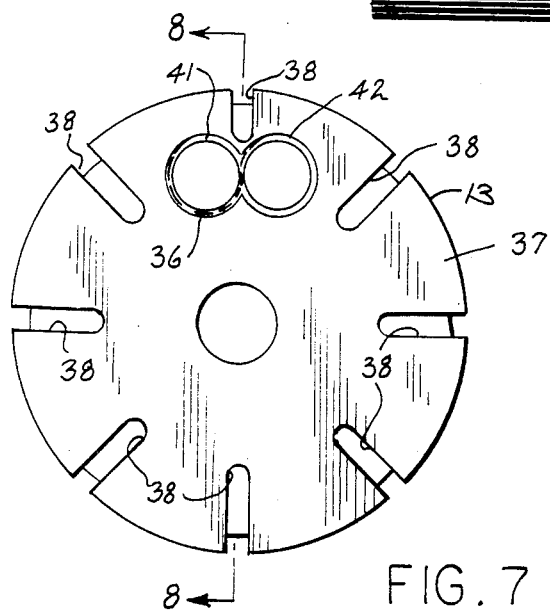
FIG. 7 is an elevation view of a left hand end plate for the switch of FIG. 1.
Figure 8:
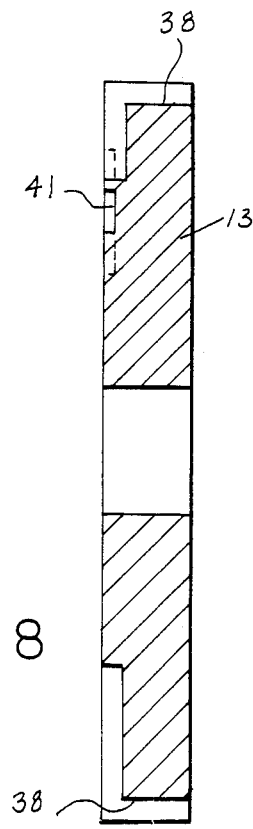
FIG. 8 is a sectional view taken from the plane of the line 8—8 of FIG. 7.

The first layer of superconductive wire 34 of the outer windings 22 is wound over the glass tape layer on the outside of the heater sheet 32. The wire 34 is also bifilarly wound and is started at the same end of the switch 10 as the wire 24 by looping the middle of the wire 34 in a tear drop shaped groove 36 (indicated by the tear drop shaped center line in FIG. 7, see also FIG. 3) in the face 37 of end plate 13 which faces the core 12. The windings of wire 34 are started at the same end of the switch 10 and wound in the same direction around the core 12 as the last layer of the wire 24. L-shaped recesses 38 are formed in the end plates 13 and 14 to allow for the flow of epoxy into the inner windings upon impregnation.

Figure 3:
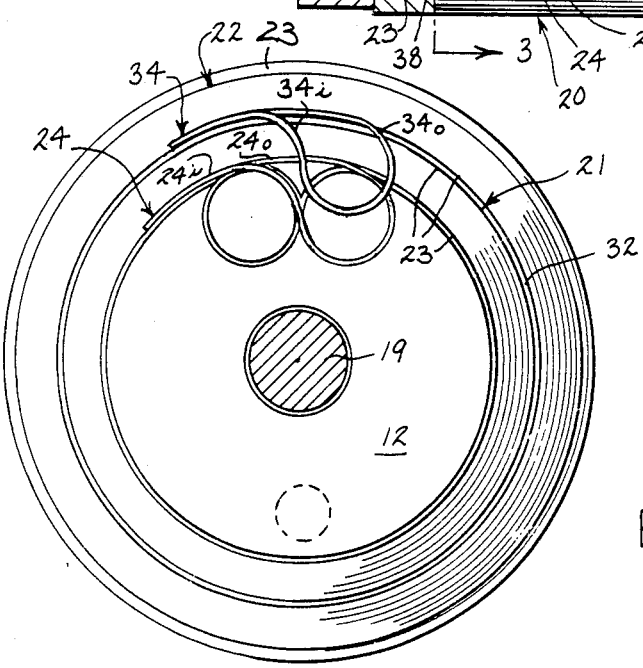
FIG. 3 is a sectional view taken along the plane of the line 3—3 of FIG. 2.
Figure 4:
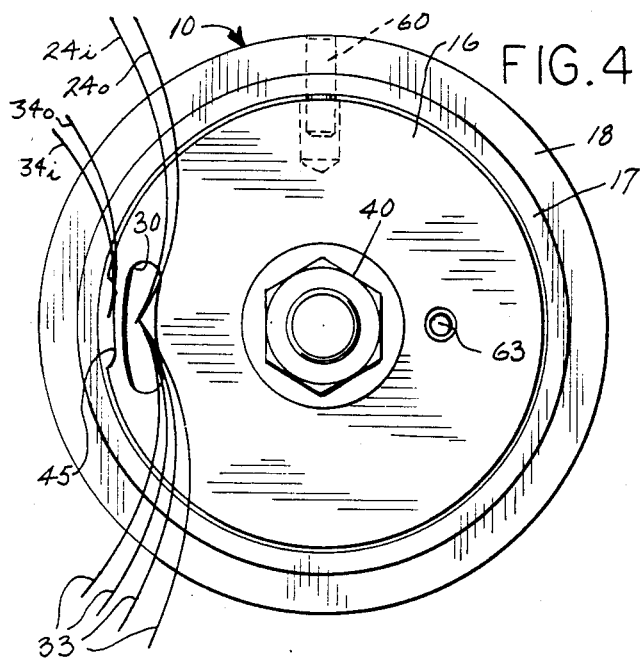
FIG. 4 is an end view taken along the plane of the line 4—4 of FIG. 1.

The groove 36 is at about the same angular location as but is radially further out from the center of the switch 10 than the groove 26. As the windings 20 are built up by making the inner windings 21 and the windings associated with the heater sheet 32, the diameter of the switch 10 is correspondingly built up. By the time the windings 22 are to be started with the first winding of the wire 34, the groove 36 is covered up by the core 12, windings 21, and the windings associated with the heater sheet 32 (as best shown in FIG. 3) when nuts 39 and 40 on the stud 19 are tightened drawing the end plates 13 and 14 against the ends of the core 12 and windings 20. This keeps the loop of the wire 34 from coming out of the groove 36. The groove 36 is also formed by two circular grooves 41 and 42 in the face 37 for ease of manufacture.

The procedure for the windings 22 is then the same as the procedure for the windings 21, with fiberglass layers interposed between wire layers and the cross-overs from layer to layer made as described. However, only seven layers of wire windings are required in windings 22 because of their greater diameter to reach the same length of wire wound in the windings 21. At the end of the seventh layer, ends 34i and 34o are guided out through recesses 44 and 45 in end plates 14 and 16, respectively, and are electrically insulated through the recesses 44 and 45 by a suitable piece of insulating tubing, not shown. The seventh layer of wire 34 is then overwrapped with more glass felt to an outside diameter which will allow the assembly to be inserted into the nylon sleeve 17 without rumpling the glass felt, yet will not allow regions of epoxy without glass felt more than 0.010" thick upon impregnation. Glass tape may also be used to secure the last layer of glass felt so that it is easier to insert the completed winding into the sleeve 17.

To complete the construction of the switch 10, the outer housing 18, which is made of aluminum or other material of a high coefficient of thermal expansion, is slid over the nylon sleeve 17 and a pin 60 is press fitted through the housing 18, nylon sleeve 17 and into the end plate 16 to prevent relative rotation therebetween. Another pin 63 (FIG. 2) is also press fitted into the end plates 14 and 16 and into the core 12 to prevent rotation between those parts.

The pin 63 also positions the tear drop shaped groove 6 at the opposite end of the switch at about the same angular location as the slots 30 and 31 and recesses 44 and 45. Thus, rotation between the core 12, end plate 14, end plate 16, sleeve 17 and housing 18 is prevented and the slots 30 and 31 and recesses 44 and 45 are at about the same angular location. This angular location is approximately the same as the angular location of the groove 26, which is about the same as the angular location of the groove 36, so that the windings of the wires 24 and 34 start and stop at about the same angular locations.

The threaded stud 19 extends through the entire assembly and nuts 39 and 40 bear against washers against the end plates 15 and 16 to hold the assembly axially together. The entire assembly is then vacuum impregnated with a suitable epoxy to fill any voids inside the switch and hold the wires against any movement when they are placed in a magnetic field.

The superconducting wire 1 and 2 is a copper matrix niobium-titanium multifilamentary superconducting composite conductor. Preferably, the superconducting material of the filaments is nominally 46.5 weight percent titanium. The volume ratio of copper to niobium-titanium is nominally 2.00:1 in the final conductor.

Each wire is flattened for an accurate winding and good field cancellation and is nominally 0.016 in. by 0.037 in. prior to insulation. The equivalent filament diameter in the final conductor is nominally 40 microns. The insulation of each wire is a coating of fully cured formvar varnish. Each wire is about 220 feet long, with 200 feet wound inside the switch and 20 feet outside of the switch which makes up the switch leads. The critical current of each wire in a one Tesla magnetic field at 4.2° K. is at least 500 A. The normal operating current may be much less than this such that a much lower critical current would suffice as contemplated in the preferred embodiment, for example, 100 A.

The heater sheet 32 is in thermal communication with both wires 24 and 34 in the switch 10. Heat generated by energizing one of the heater elements A or B is conducted from the inside face of sheet 32 through the inside fiberglass layer to the wire 24 and from the outside face through the outside fiberglass layer to the wire 34. Because the same heater element warms approximately equal lengths of both wires 24 and 34, heating begins at the same time and proceeds at approximately the same rate for each wire. Thus, the wires reach the critical current at about the same time to accomplish simultaneous switching off. Switching on also occurs substantially simultaneously upon turning off the heater element because both wires are controlled by the same heater element and also because they are subjected to substantially the same thermal conditions, being in the same housing and proximate (only separated by two layers of fiberglass cloth and the heater element).

Many modifications and variations of the preferred embodiment will be apparent to those of ordinary skill in the art but will still be within the spirit and scope of the invention. For example, more than two wire windings could be contained within the same housing and controlled by the same heater, and/or the wire windings could be arranged axially next to each other with a common heater element inside, outside, or between them. Therefore, the invention should not be limited by the scope of the preferred embodiment, but only by the claims which follow.

I claim:

1. A superconducting switch, comprising:
   a housing;
   at least two lengths of superconductor in said housing, each said length being electrically insulated from the other length and having ends which extend outside of the housing for connection to a superconducting circuit; and
   a heater element in said housing, said heater element being in thermal communication with each length of superconductor;
   wherein the heater element controls whether both lengths of superconductor are persistent or non-persistent and does so substantially simultaneously.

2. A superconducting switch as in claim 1, wherein the switch has two lengths of superconductor.

3. A superconducting switch as in claim 1, wherein one side of the heater element is used to heat one of the lengths of superconductor and the other side is used to heat another of the lengths of superconductor.

4. A superconducting switch as in claim 1, further comprising a core and wherein the lengths of superconductor are wound around the core.

5. A superconducting switch as in claim 4, wherein at least two of the lengths of superconductor are each wound around the core with one of said lengths radially outward from the other said length and wherein the heater element is radially between said two lengths.

6. A superconducting switch as in claim 5, wherein each of said two lengths of superconductor is bifilarly wound around the core and wherein the core has a groove defined in its end and the winding of the radially inner length of superconductor is started in said groove and further comprising an end plate against an end of the core, said end plate having an end plate surface facing the core which has a groove defined in it, wherein the winding of the radially further out length of superconductive wire is started in the end plate groove.

7. A superconducting switch as in claim 6, wherein the groove in the end plate is at least partially covered by the winding of the radially inner length of superconductor.

8. A superconducting switch as in claim 6, wherein the wire windings start at approximately the same angular location and stop at approximately the same angular location.

9. A superconducting switch as in claim 8, wherein the angular location where the wire windings start is at about the same angular location where the wire windings stop.

10. A superconducting switch as in claim 6, wherein the groove in the end plate is radially further out than the groove in the core 11. A superconducting switch as in claim 10, wherein the end plate surface is against the end of the core having the groove in it.

* * * * *